(12) United States Patent
Yamane

(10) Patent No.: US 8,525,385 B2
(45) Date of Patent: Sep. 3, 2013

(54) BOUNDARY ACOUSTIC WAVE DEVICE

(75) Inventor: Takashi Yamane, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/252,221

(22) Filed: Oct. 4, 2011

(65) Prior Publication Data

US 2012/0262028 A1    Oct. 18, 2012

Related U.S. Application Data

(63) Continuation of application No. PCT/JP2010/056301, filed on Apr. 7, 2010.

(30) Foreign Application Priority Data

Apr. 14, 2009    (JP) .................................. 2009-097931

(51) Int. Cl.
*H03H 9/25*    (2006.01)

(52) U.S. Cl.
USPC .................................. 310/313 B; 310/313 A

(58) Field of Classification Search
USPC ................. 310/313 A–313 D, 313 R
See application file for complete search history.

(56) References Cited

U.S. PATENT DOCUMENTS

| | | | |
|---|---|---|---|
| 8,074,341 B2 * | 12/2011 | Kando et al. ..................... 29/594 |
| 2008/0290968 A1 | 11/2008 | Yamamoto et al. |
| 2009/0115287 A1 | 5/2009 | Kando |
| 2009/0189483 A1 | 7/2009 | Kadota et al. |
| 2009/0295508 A1 * | 12/2009 | Isobe et al. ..................... 333/195 |
| 2012/0056506 A1 * | 3/2012 | Kando et al. ............... 310/313 B |
| 2012/0133246 A1 * | 5/2012 | Yaoi et al. ..................... 310/313 |

FOREIGN PATENT DOCUMENTS

| | | |
|---|---|---|
| JP | 2008-294538 A | 12/2008 |
| WO | 98/52279 A1 | 11/1998 |
| WO | 2006/114930 A1 | 11/2006 |
| WO | 2007/097151 A1 | 8/2007 |
| WO | 2008/044411 A1 | 4/2008 |

OTHER PUBLICATIONS

Official Communication issued in International Patent Application No. PCT/JP2010/056301, mailed on Jul. 13, 2010.

* cited by examiner

*Primary Examiner* — Thomas Dougherty
(74) *Attorney, Agent, or Firm* — Keating & Bennett, LLP

(57) ABSTRACT

In a boundary acoustic wave device, a silicon oxide layer and a dielectric layer exhibiting a higher acoustic velocity than the silicon oxide layer are stacked on a $LiTaO_3$ piezoelectric substrate, and IDT electrodes are disposed in grooves in an upper surface of the piezoelectric substrate. Each of the IDT electrodes includes a main electrode layer made of a metal having a density of about 16 g/cm$^3$ or higher, and an auxiliary electrode layer made of a metal having a density within a range of about 3 g/cm$^3$ to about 16 g/cm$^3$. Further, θ of Euler angles (0°, θ, 0°) of the piezoelectric substrate is set within a range of about $(θ_0-20°)$ to about $(θ_0+20°)$ with respect to $θ_0$ expressed by the formula:

$$θ_0=65.53G+0.7568F+0.8454E+7.091D+1.609C-0.03789B-3.535A+60.85.$$

9 Claims, 7 Drawing Sheets

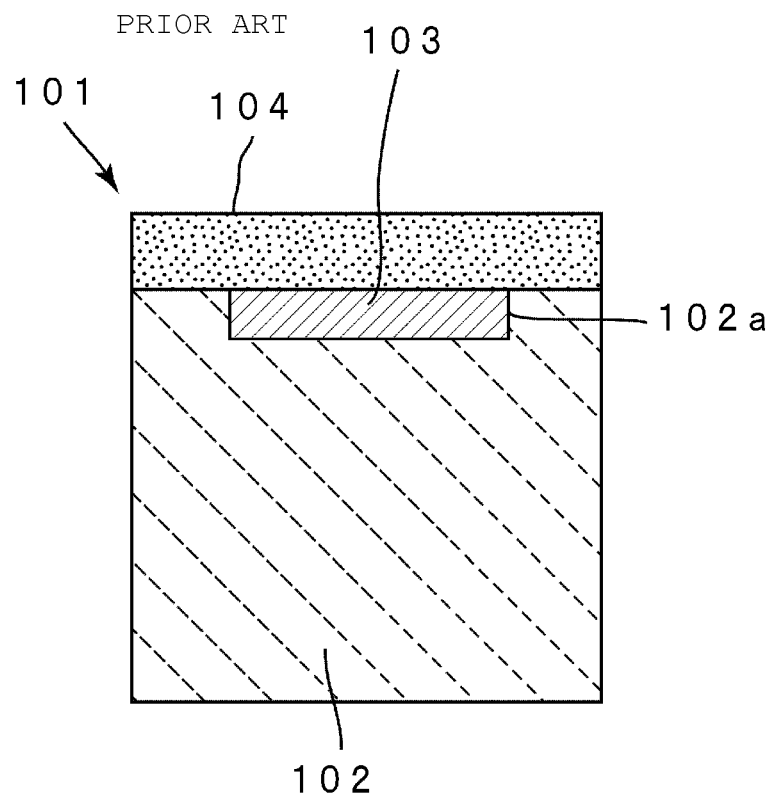

BOUNDARY ACOUSTIC WAVE DEVICE

BACKGROUND OF THE INVENTION

1. Field of the Invention

The present invention relates to a boundary acoustic wave device for use as a resonator or a filter device, for example, and more particularly to a boundary acoustic wave device including a three-medium structure in which a silicon oxide layer and a dielectric layer made of material exhibiting a higher acoustic velocity than that in the silicon oxide are stacked on a piezoelectric substrate made of $LiTaO_3$.

2. Description of the Related Art

Attention is focused on a boundary acoustic wave device instead of a surface acoustic wave device. The boundary acoustic wave device does not require a package having a cavity and hence contributes to a further reduction of size.

WO2008/044411 discloses a boundary acoustic wave device 101 having a sectional structure illustrated in FIG. 10. In the boundary acoustic wave device 101, a groove 102a is formed in an upper surface of a $LiNbO_3$ substrate 102. An IDT electrode 103 is formed by filling a metal material in the groove 102a. In FIG. 10, only one electrode finger of the IDT electrode 103 is illustrated in an enlarged scale.

A silicon oxide film 104 is formed to cover an upper surface of the $LiNbO_3$ substrate 102. WO2008/044411 states that because an upper surface of the IDT electrode 103 is flush with the upper surface of the $LiNbO_3$ substrate 102, an upper surface of the silicon oxide film 104 can be made flat, and hence an insertion loss can be reduced.

Further, WO2008/044411 states that a loss in utilizing an SH boundary acoustic wave can be reduced by setting θ between the Euler angles of the $LiNbO_3$ substrate, a thickness of the silicon oxide film 104, and a thickness of the IDT electrode 103 to respective particular ranges.

Moreover, WO2008/044411 discloses a structure using $LiTaO_3$ instead of $LiNbO_3$.

In the boundary acoustic wave device described in WO2008/044411 1 and using $LiTaO_3$, however, it has been discovered by the inventors of the present application that although leakage of the SH boundary wave to the silicon oxide film 104 is suppressed, energy of the boundary acoustic wave is leaked to the piezoelectric substrate made of $LiTaO_3$ and a propagation loss cannot be sufficiently reduced.

SUMMARY OF THE INVENTION

Preferred embodiments of the present invention overcome the above-mentioned problems in the related art and provide a boundary acoustic wave device in which the loss can be further reduced in comparison with that generated in the related-art boundary acoustic wave device.

A boundary acoustic wave device according to a preferred embodiment of the present invention includes a piezoelectric substrate made of $LiTaO_3$ and including a groove provided in an upper surface thereof, an IDT electrode arranged such that at least a portion of the IDT electrode is buried in the groove of the piezoelectric substrate, a silicon oxide layer stacked on the piezoelectric substrate, and a dielectric layer made of a dielectric exhibiting a higher acoustic velocity than the silicon oxide layer. The IDT electrode preferably includes a main electrode layer made of a metal having a density of about 16 $g/cm^3$ or higher, and an auxiliary electrode layer made of a metal having a density of about 4 $g/cm^3$ or higher, but lower than about 16 $g/cm^3$, for example. Where a wavelength of a boundary acoustic wave excited by the IDT electrode is λ, a depth A of the groove corresponding to a partial length of the IDT electrode buried in the groove is preferably within a range of about 0.1% to about 10% of λ, for example. Further, a film thickness B of the silicon oxide layer is preferably within a range of about 20% to about 140% of λ, for example. The density of the main electrode is denoted by C ($g/cm^3$), and a thickness D of the main electrode layer is preferably within a range of about 1% to about 10% of λ, for example. The density of the auxiliary electrode is denoted by E ($g/cm^3$), and a thickness F of the auxiliary electrode positioned above the main electrode layer is preferably within a range of about 0 to about 10% of λ, for example. A duty G of the IDT electrode is preferably within a range of about 0.4 to about 0.7, for example. Based on the above conditions, θ of Euler angles (0°, θ, 0°) of the piezoelectric substrate made of $LiTaO_3$ is preferably set, for example, within a range of about $(\theta_0-20°)$ or more to about $(\theta_0+20°)$ or less with respect to $\theta_0$ expressed by a formula (1) given below.

$$\theta_0 = 65.53G + 0.7568F + 0.8454E + 7.091D + 1.609C - 0.03789B - 3.535A + 60.85 \quad \text{formula (1)}$$

In one particular preferred embodiment of the boundary acoustic wave device according to the present invention, the groove depth A buried with the IDT electrode is preferably within a range of about 3% to about 10% of the wavelength λ, the film thickness B of the silicon oxide layer is preferably within a range of about 30% to about 80% of λ, the thickness D of the main electrode layer is preferably within a range of about 1% to about 10% of λ, the thickness F of the auxiliary electrode layer positioned above the main electrode layer preferably is about 5% or less, and the duty G of the IDT electrode is preferably within a range of about 0.45 to about 0.55, for example. In that case, a degree of energy concentration (described later) of the boundary acoustic wave can be increased to about 90% or above, whereby a propagation loss can be reduced and characteristics of the boundary acoustic wave device can be further improved.

More preferably, θ is preferably set within a range of about $(\theta_0-10°)$ or more to about $(\theta_0+10°)$ or less, for example. In that case, in propagation of the boundary acoustic wave, the degree of energy concentration (described later) can be increased to about 99% or above, and the propagation loss can be further reduced and minimized.

In the boundary acoustic wave device according to a preferred embodiment of the present invention, the IDT electrode may further include a low-density electrode layer preferably made of a metal having a density of lower than about 4 $g/cm^3$, for example. The low-density electrode layer may be made of, e.g., Al or an alloy containing Al as a main component. By including the low-density electrode layer, the electrical resistance of the IDT electrode is significantly reduced.

In another preferred embodiment of the boundary acoustic wave device according to the present invention, the IDT electrode includes the main electrode layer, the auxiliary electrode layer stacked above the main electrode layer, and another auxiliary electrode layer stacked below the main electrode layer. Thus, in the IDT electrode, the auxiliary electrode layer may be stacked below the main electrode layer. By properly selecting a material of the auxiliary electrode layer, it is possible to increase adhesion of the auxiliary electrode layer to adjacent layers on both sides thereof, and to prevent diffusion of the electrode material. As a result, electrical characteristics and reliability of the boundary acoustic wave device are greatly improved.

In still another particular preferred embodiment of the boundary acoustic wave device according to the present invention, the metal constituting the main electrode layer preferably is at least one kind of metal selected from a group consisting of Pt, W, Ta, Au and Ir, or an alloy containing at least one kind of those metals as a main component. In that case, the reliability is greatly improved.

In still another particular preferred embodiment of the boundary acoustic wave device according to the present invention, the auxiliary electrode layer is preferably made of at least one kind of metal selected from a group consisting of Ti, $TiO_2$, TiN, Ni and NiCr. In that case, adhesion to other adjacent electrode layer, dielectric, and/or piezoelectric substance is significantly increased, and the reliability is greatly improved. Further, the electrode material can be prevented from being diffused between the electrode layers on both sides of the auxiliary electrode layer.

In still another particular preferred embodiment of the boundary acoustic wave device according to the present invention, the dielectric layer is preferably made of one kind of dielectric material selected from a group consisting of silicon nitride, silicon oxynitride, aluminum nitride, aluminum oxide, and silicon. The dielectric layer can be easily formed by using any of those generally used dielectric materials, therefore, transmission characteristics are greatly improved due to the waveguide effect.

With the boundary acoustic wave device according to various preferred embodiments of the present invention, since at least a portion of the IDT electrode is buried in the groove, the electromechanical coupling coefficient $K^2$ can be increased and a wider pass band can be obtained. Since the dielectric layer exhibiting a relatively high acoustic velocity is disposed on the silicon oxide layer, the boundary acoustic wave can be satisfactorily confined inside the dielectric layer, and the transmission characteristic can be greatly improved.

In addition, since the IDT electrode includes the main electrode layer and the auxiliary electrode layer and θ of the Euler angles of the piezoelectric substrate is preferably set, for example, within the range of about $(θ_0-20°)$ or more to about $(θ_0+20°)$ or less with respect to $θ_0$ expressed by the formula (1), it is possible to suppress and prevent leakage of the boundary acoustic wave to the piezoelectric substrate side, and to effectively increase the degree of energy concentration (described later). Hence, the loss can be further reduced in comparison with that generated in the related-art boundary acoustic wave device having the structure in which the IDT electrode is buried in the groove.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a schematic sectional view used to explain an electrode structure of a boundary acoustic wave device in the related art.

DETAILED DESCRIPTION OF THE PREFERRED EMBODIMENTS

The present invention will be clarified by the following description of preferred embodiments of the present invention with reference to the drawings.

Figure 2A:
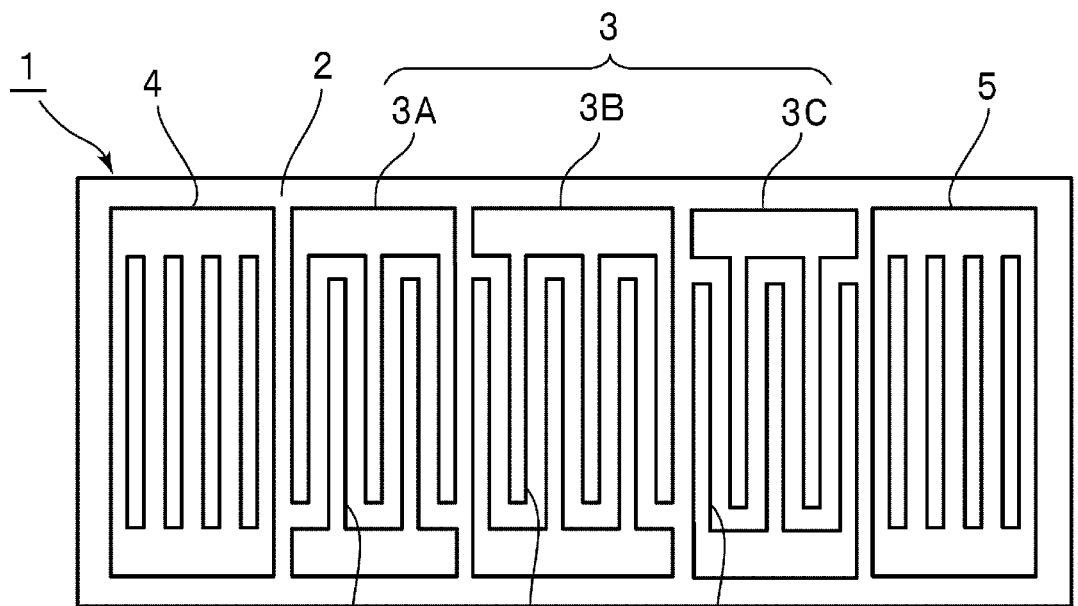
FIG. 2A is a schematic plan view illustrating the electrode structure of the boundary acoustic wave device according to a preferred embodiment of the present invention.
Figure 2B:
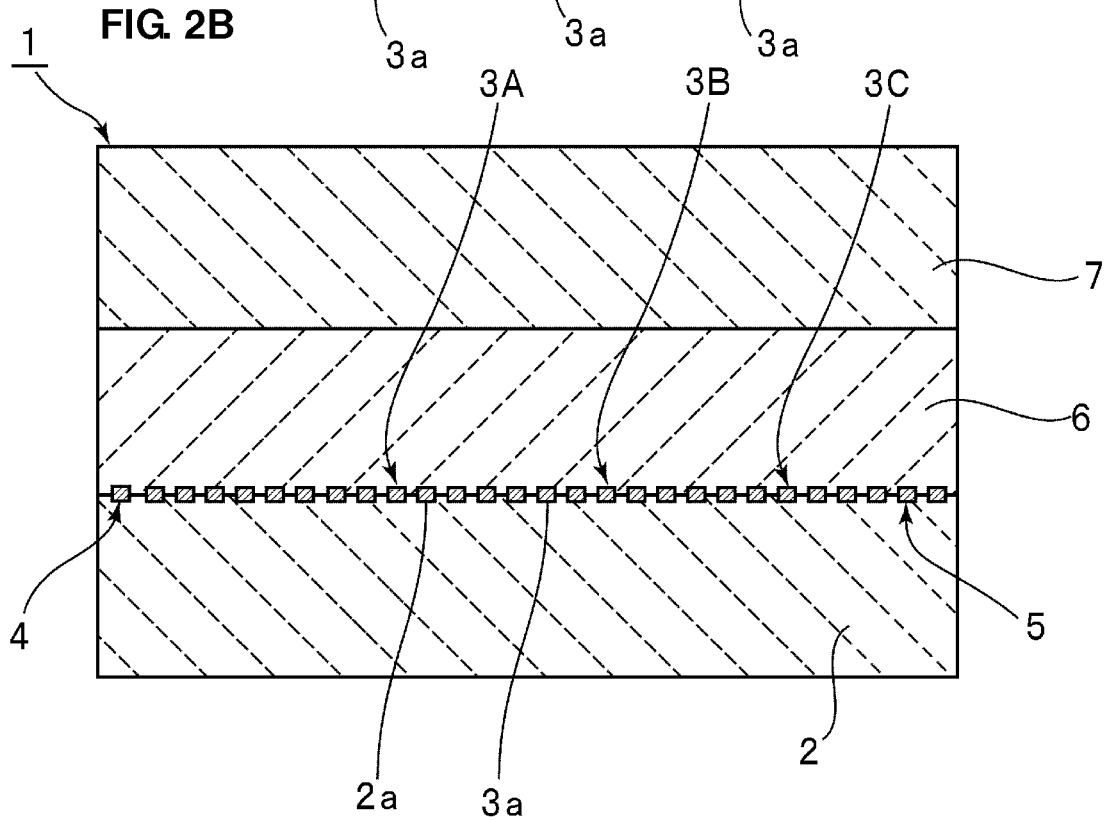
FIG. 2B is a schematic front sectional view of the boundary acoustic wave device according to the preferred embodiment of the present invention shown in FIG. 2A.

FIGS. 2A and 2B are respectively a schematic plan sectional view and a schematic front sectional view to explain a boundary acoustic wave device according to a preferred embodiment of the present invention.

As illustrated in FIG. 2B, a boundary acoustic wave device 1 includes a piezoelectric substrate 2 preferably made of $LiTaO_3$. Grooves 2a are provided in an upper surface of the piezoelectric substrate 2.

An IDT electrode 3 is arranged such that at least a portion of each of IDT electrodes 3A to 3C in the thickness direction of the IDT electrode 3 is filled in the grooves 2a.

In this preferred embodiment, as illustrated in FIG. 2A, an electrode structure includes the IDT electrodes 3A to 3C and reflectors 4 and 5 arranged on both sides, as viewed in a direction of propagation of a boundary acoustic wave, of a region where the IDT electrodes 3A to 3C are disposed. Stated another way, a 3IDT longitudinally coupled resonator-type boundary acoustic wave filter is constituted by such an electrode structure. Each of the IDT electrodes 3A to 3C includes a plurality of electrode fingers 3a. The reflectors 4 and 5 preferably are each a grating-type reflector in which a plurality of electrode fingers are shorted at both ends thereof.

A silicon oxide layer 6 is arranged to cover the above-described electrode structure. A dielectric layer 7 made of a dielectric material exhibiting a higher acoustic velocity than the silicon oxide layer 6 is provided on an upper surface of the silicon oxide layer 6. In this preferred embodiment, the dielectric layer 7 is preferably made of silicon nitride.

Thus, the boundary acoustic wave device 1 is a boundary acoustic wave device including a so-called three-medium structure in which the piezoelectric substrate 2, the silicon oxide layer 6, and the dielectric layer 7 are stacked in the order named. In the boundary acoustic wave device of the so-called three-medium structure, because of including the dielectric layer 7 that exhibits a higher acoustic velocity than the silicon oxide layer 6, the boundary acoustic wave is confined inside the dielectric layer 7. Accordingly, losses are significantly reduced due to the waveguide effect.

Further, the electrode fingers of the IDT electrodes 3A to 3C and the reflectors 4 and 5 are each partially buried in the groove 2a. Thus, since the electrode finger is formed by filling a portion of an electrode material in the groove, the electromechanical coupling coefficient $K^2$ can be increased in the IDT electrodes 3A to 3C. As a result, a fractional band width is significantly increased.

In addition, in the boundary acoustic wave device 1 of this preferred embodiment, the IDT electrode 3 includes a main electrode layer and an auxiliary electrode layer described later, and θ of the Euler angles of LiTaO$_3$ is set to a particular range, whereby boundary acoustic waves excited in the IDT electrodes 3A to 3C are effectively suppressed and prevented from leaking toward the piezoelectric substrate 2. As a result, a degree of energy concentration in propagation of the boundary acoustic wave can be increased and a propagation loss can be reduced. That point will be described in more detail below.

Figure 1:
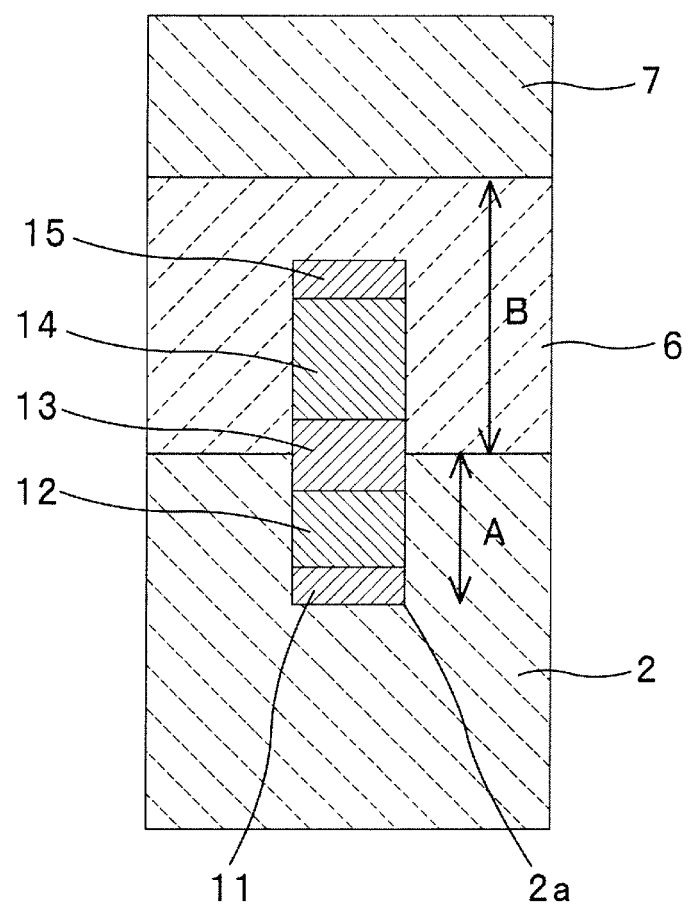
FIG. 1 is a partial enlarged front sectional view to explain an electrode structure of a boundary acoustic wave device according to a preferred embodiment of the present invention.

FIG. 1 illustrates, in an enlarged scale, a portion in which one electrode finger of the IDT electrode 3 in the boundary acoustic wave device 1 of this preferred embodiment is provided. As illustrated in FIG. 1, the IDT electrode 3 is partially buried in the groove 2a. Here, a depth of the groove 2a is denoted by A.

The IDT electrode 3 preferably includes a Ti film 11, a Pt film 12, a Ti film 13, an Al film 14, and a Ti film 15, which are successively stacked in the order named from the bottom.

Ti has a density of 4.54 g/cm$^3$, Pt has a density of 21.45 g/cm$^3$, and the Al film has a density of 2.7 g/cm$^3$.

In this description, the plural electrode layers constituting the IDT electrode are classified as follows depending on the density of each electrode layer.

The electrode layer made of a metal having a density of about 16 g/cm$^3$ or higher, for example, is preferably used as a main electrode layer. Accordingly, the Pt film 12 is the main electrode layer. The electrode layer made of a metal having a density of about 4 g/cm$^3$ or higher, but lower than about 16 g/cm$^3$, for example, is preferably used as an auxiliary electrode layer. Accordingly, the Ti films 11, 13 and 15 are each the auxiliary electrode layer.

The electrode layer having a density of lower than about 4 g/cm$^3$, for example, is preferably used as a low-density electrode layer. Accordingly, the Al film 14 is the low-density electrode layer.

One of the unique features of the present preferred embodiment of the present invention resides in that, where the depth of the groove 2a is A, the thickness of the silicon oxide layer 6 is B, the density of the main electrode layer is C (g/cm$^3$), the thickness of the main electrode layer is D, the density of the auxiliary electrode layer is E (g/cm$^3$), the thickness of the auxiliary electrode layer positioned above the main electrode layer is F, and the duty ratio of the IDT is G, values of those parameters are within respective ranges mentioned below, and θ of the Euler angles of the LiTaO$_3$ substrate is, for example, preferably within a range of about ($θ_0−20°$) or more to about ($θ_0+20°$) or less with respect to $θ_0$ expressed by a formula (1) given below.

In this description, each of values (in unit of %) of the groove depth A, the thickness B of the silicon oxide layer 6, the thickness D of the main electrode layer, and the thickness F of the auxiliary electrode layer represents a normalized thickness that implies, when the wavelength of the boundary acoustic wave excited by the IDT electrode 3 is denoted by λ, a proportion (%) with respect to the wavelength λ.

In this preferred embodiment, the groove depth A preferably is within a range of about 0.1% to about 10% of λ, the film thickness B of the silicon oxide layer 6 is preferably within a range of about 20% to about 140% of λ, and the thickness D of the main electrode layer is preferably within a range of about 1% to about 10%, for example. The thickness F of the auxiliary electrode layer positioned above the main electrode layer is preferably within a range of about 0 to about 10%, and the duty ratio G is preferably within a range of about 0.4 to about 0.7, for example. Based on the condition that the parameters A to G take arbitrary values within the respective ranges mentioned above, θ of the Euler angles ($θ_0−20°$) is preferably set within the range of about ($θ_0−20°$) or more to about ($θ_0+20°$) or less, for example.

$$θ_0=65.53G+0.7568F+0.8454E+7.091D+1.609C−0.03789B−3.535A+60.85 \quad \text{formula (1)}$$

The above points will be described below based on specific experimental examples.

FIRST EXAMPLE

A longitudinally coupled resonator-type boundary acoustic wave device 1 of a FIRST EXAMPLE was fabricated in the following specifications according to the above-described preferred embodiment, and an attenuation-frequency characteristic thereof was measured.

The thicknesses of the layers of the boundary acoustic wave device 1 were set as follows.

Dielectric layer 7 made of silicon nitride=2200 nm
Silicon oxide layer 6=760 nm
Electrode multilayer structure: Ti/Al/Ti/Pt/Ti=10/150/10/76/10 in the order from top (each value in unit of nm)

Further, θ of the Euler angles of the piezoelectric substrate 2 made of LiTaO$_3$ was set to 138°. Thus, the Euler angles are given by (0°, 138°, 0°), and hence a propagation angle ψ was 0°. The depth of the groove 2a was set to 86 nm.

The duty ratio of the IDT electrode 3 was set to 0.50.

The electrode finger intersecting width in the IDT electrode 3 was set to 80 μm, and the numbers of pairs of the electrode fingers in the IDT electrodes 3A to 3C were set to 8, 14 and 8, respectively. The numbers of pairs of the electrode fingers in each of the reflectors 4 and 5 was set to 15. Further, λ in the IDT electrodes 3A to 3C was set to 1.9 μm, and two electrode fingers at opposing ends of adjacent IDTs were constituted as narrow-pitch electrode fingers. Also, λ in the narrow-pitch electrode fingers was set to 1.7 μm.

Moreover, λ in each of the reflectors 4 and 5 was set to 1.92 μm.

Thus, A=4.53%, B=40%, D=4.0%, F=1.58 (=0.526×3) % were set.

The 3IDT longitudinally coupled resonator-type boundary acoustic wave filter device was fabricated as described above and was measured for a transmission characteristic. The measured result is indicated by a solid line in FIG. 3. For comparison, a boundary acoustic wave device as a modification was fabricated in a similar manner to that described above except that θ of the Euler angles was changed from 138° to 126°, and it was measured for a transmission characteristic. A broken line in FIG. 3 indicates the result measured in the case of θ=126°.

Figure 3:
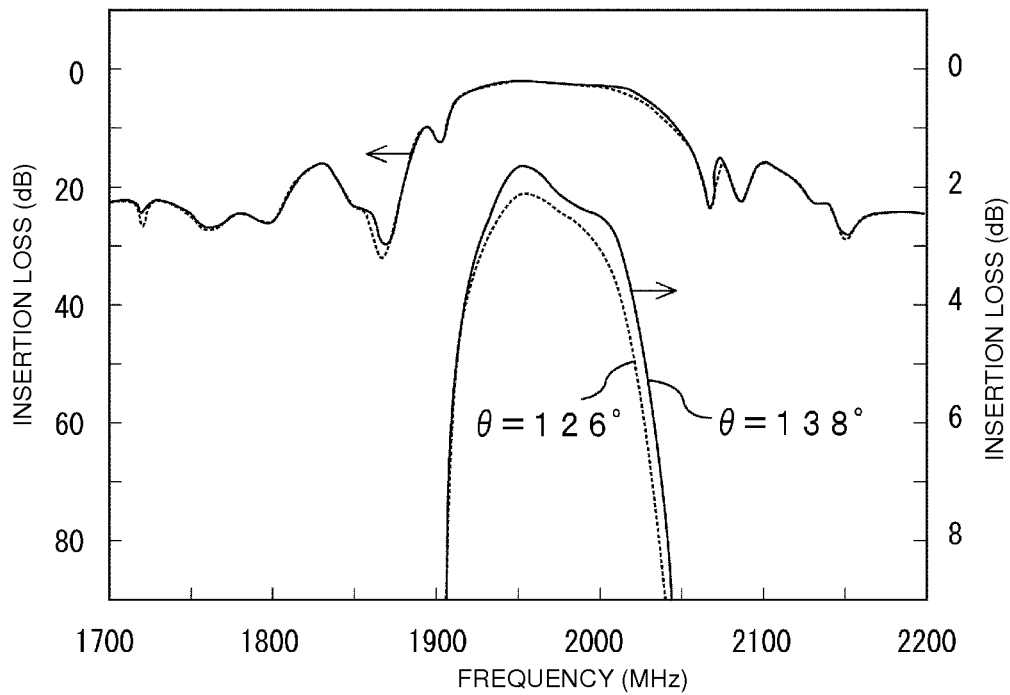
FIG. 3 is a graph plotting an attenuation-frequency characteristic of each of boundary acoustic wave devices according to a FIRST EXAMPLE of a preferred embodiment of the present invention and a modification thereof.

As seen from FIG. 3, the loss within a pass band can be reduced in the case of θ=138° as compared with that in the case of θ=126°. Such a loss reduction can be thought of as being attributable to the fact that θ of the Euler angles is closer to an optimum angle. That point is described in more detail below.

SECOND EXAMPLE

A 3IDT longitudinally coupled resonator-type boundary acoustic wave device of a SECOND EXAMPLE was fabricated in a similar manner to that in the FIRST EXAMPLE except that θ of the Euler angles was changed to 132°. A transmission characteristic of the fabricated boundary acoustic wave device is indicated by a solid line in FIG. 4. For comparison, a boundary acoustic wave device as a comparative example was fabricated in a similar manner to that described above except that the groove depth A buried with the IDT electrode was changed from 86 nm to 0 nm, i.e., that the groove was not formed. A broken line in FIG. 4 indicates a transmission characteristic of the boundary acoustic wave device as the comparative example.

Figure 4:
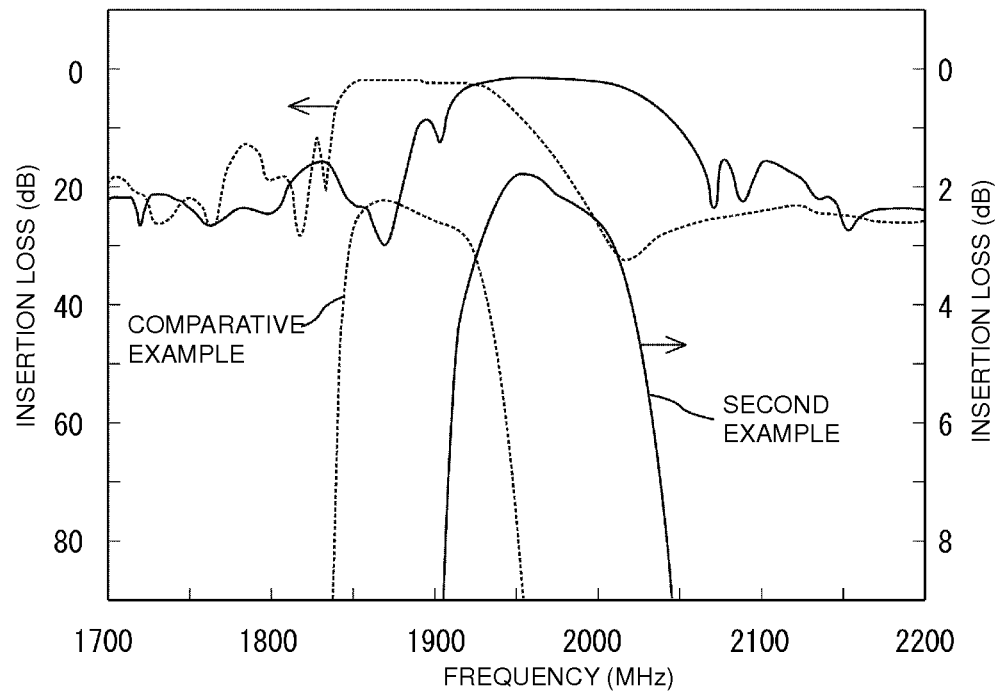
FIG. 4 is a graph plotting attenuation-frequency characteristics of a boundary acoustic wave device according to a SECOND EXAMPLE of a preferred embodiment of the present invention and a boundary acoustic wave device as a comparative example.

As seen from FIG. 4, the SECOND EXAMPLE can provide a wider pass band and a smaller loss in the pass band than those in the comparative example. Further, the SECOND EXAMPLE can provide the pass band at higher frequencies. Those results are attributable to the fact that, since the IDT electrode is partially buried in the groove 2a, the electromechanical coupling coefficient $K^2$ is increased and hence the pass band is widened. Further, it is thought that, since θ of the Euler angles comes closer to the optimum value, the acoustic velocity is increased, whereby the loss is reduced and the frequency is increased due to the higher acoustic velocity.

THIRD EXAMPLE

A boundary acoustic wave device of a THIRD EXAMPLE was fabricated as follows. The multilayer structure of each of the IDT electrodes 3A to 3C was formed as a three-layer structure of Al/Ti/Pt.

The thickness of an Al film was set to 300 nm, the thickness of a Ti film was set to 57 nm, and the thickness of a Pt film was set to 90 nm. Also, for a piezoelectric substrate made of LiTaO₃, θ of the Euler angles of the LiTaO₃ was set to 138°.

The depth of the groove 2a was set to 114 nm, and the duty ratio G in each of the IDT electrodes 3A to 3C was set to 0.45 or 0.55. The other structure was the same as that in the FIRST EXAMPLE and the SECOND EXAMPLE.

Accordingly, values of the above-mentioned parameters were given by A=6%, B=40%, D=5%, and F=3%.

In the boundary acoustic wave device thus constructed, a degree of energy concentration was calculated by the finite element method when θ of the Euler angles was changed from 120° to 160°. The calculated results are plotted in FIG. 5A.

Figure 5A:
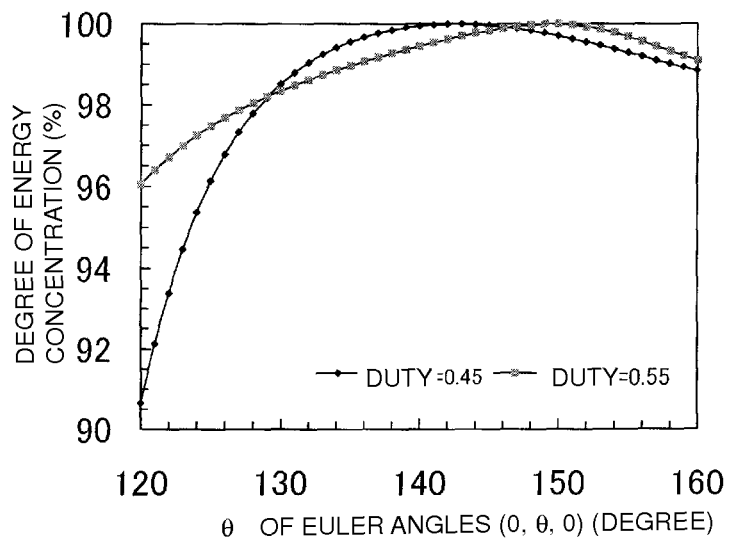
FIG. 5A is a graph plotting change in a degree of energy concentration of a boundary acoustic wave when θ between the Euler angles of $LiTaO_3$ is changed within a range of about 120° to about 160° in a THIRD EXAMPLE of a preferred embodiment of the present invention.
Figure 5B:
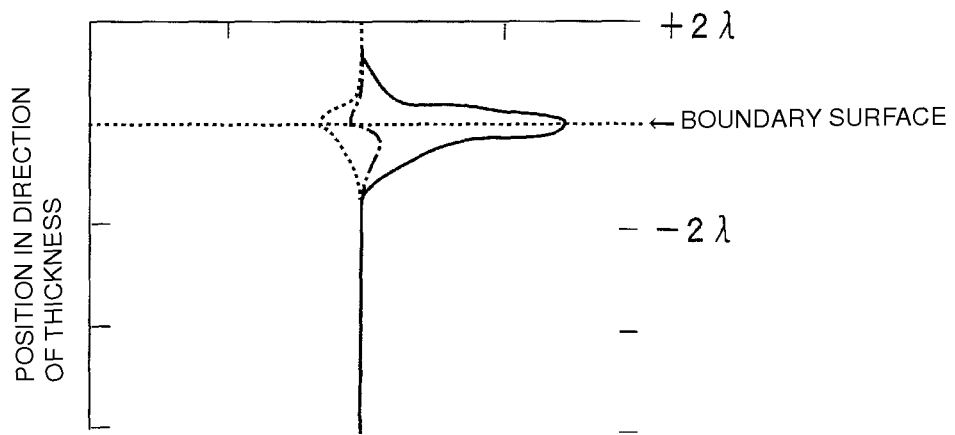
FIG. 5B is a plot representing an energy distribution.

The degree of energy concentration is obtained by, when the boundary between LiTaO₃ and the silicon oxide layer 6 in the boundary acoustic wave device is regarded to be a boundary surface as illustrated in FIG. 5B, determining an energy distribution of elastic waves at positions deviated in the direction of thickness with respect to the boundary surface, and by calculating a degree of energy concentration based on the determined energy distribution. In FIG. 5B, a solid line represents an energy distribution of an SH wave, a broken line represents an energy distribution of an SV wave, and a one-dot-chain line represents an energy distribution of a P wave. Here, the term "degree of energy concentration" implies a proportion of energy of SH boundary acoustic waves, which are present between a height position of (boundary surface+2λ) and a height position of (boundary surface−2λ), with respect to total energy of all the SH boundary acoustic waves utilized.

As seen from FIG. 5A, the degree of energy concentration is changed depending on change of θ of the Euler angles. Regardless of whether the duty G is 0.45 or 0.55, the degree of energy concentration is increased with an increase of θ within a range where θ of the Euler angles is changed from 120° to 142°. Further, when the duty ratio is 0.45, the degree of energy concentration takes a maximum value of 100% at θ=142° to 143°. When the duty ratio is 0.55, the degree of energy concentration takes a maximum value of 100% at θ=149° to 150°.

As is apparent from those results, most preferably, θ is within a range of 142° to 143° when the duty is 0.45, and θ is within a range of 149° to 150° when the duty is 0.55. The degree of energy concentration is 90% or more when θ is within a range of the above optimum value θ±20°, and 99% or more when θ is within a range of the above optimum value θ±10°.

Thus, according to the THIRD EXAMPLE, it is understood that, the optimum value of θ of the Euler angles is $θ_0$, the degree of energy concentration can be increased to 90% or above by setting θ to fall within a range of ($θ_0$−20°) or more to ($θ_0$+20°) or less. Further, the degree of energy concentration can be increased to 99% or above by setting θ to fall within a range of ($θ_0$−10°) or more to ($θ_0$+10°) or less.

FOURTH EXAMPLE

A boundary acoustic wave device was designed in the same structure as that in the THIRD EXAMPLE except that the duty was set to 0.50. Given, as primary conditions in the boundary acoustic wave device, that the groove depth A was changed from 5 to 7%, the film thickness of the silicon oxide layer was changed from 40 to 80%, the film thickness of the Pt film 12 was changed from 4 to 6%, and the total film thickness of the Ti films 13 and 15, which were positioned above the Pt film 12, between the Ti films 11, 13 and 15 was changed from 2 to 6%, $θ_0$ maximizing the degree of energy concentration was measured by the finite element method when the duty was set to each of 0.45, 0.50 and 0.55.

Figure 6:
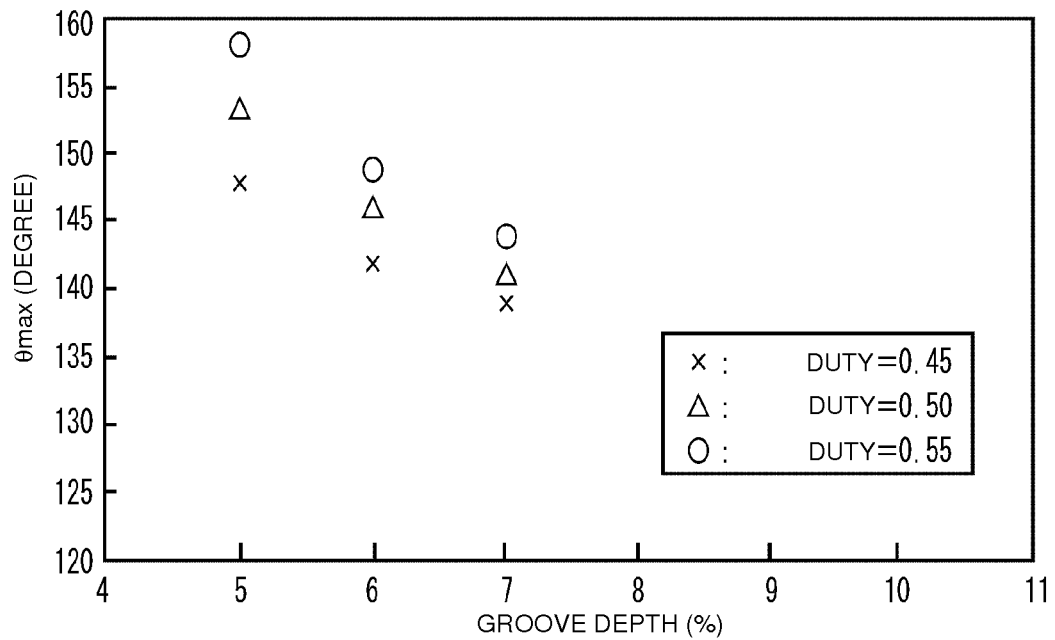
FIG. 6 is a graph plotting the relationship between a depth (%) of a groove formed in a piezoelectric substrate made of $LiTaO_3$, a duty ratio of an IDT electrode, and a maximum phase value.
Figure 7:
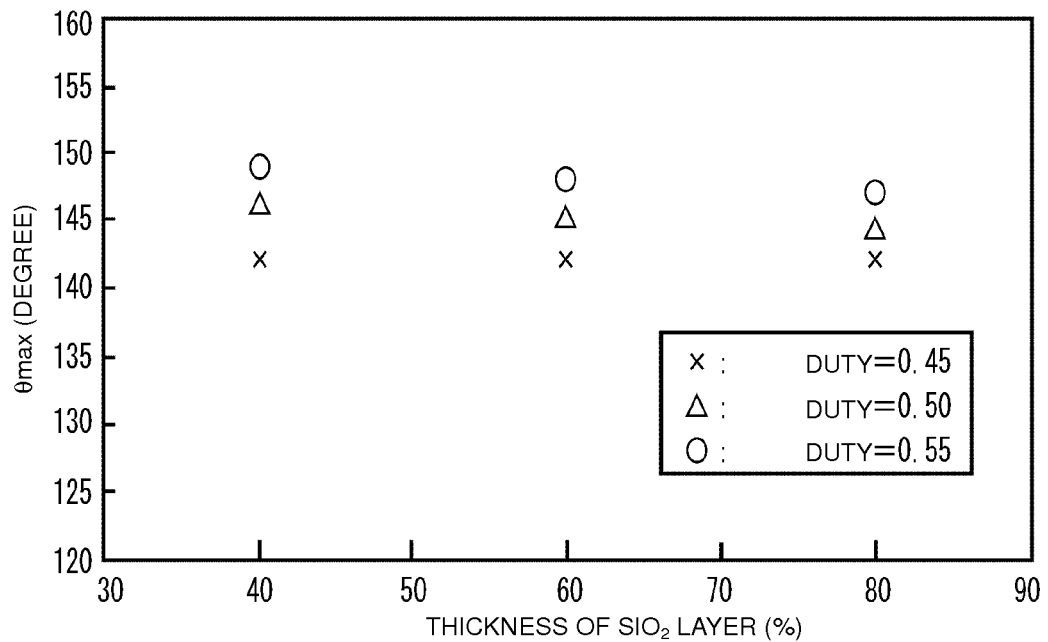
FIG. 7 is a graph plotting the relationship between a thickness (%) of a silicon oxide layer disposed on the $LiTaO_3$ substrate, a duty ratio of the IDT electrode, and a maximum phase value.
Figure 8:
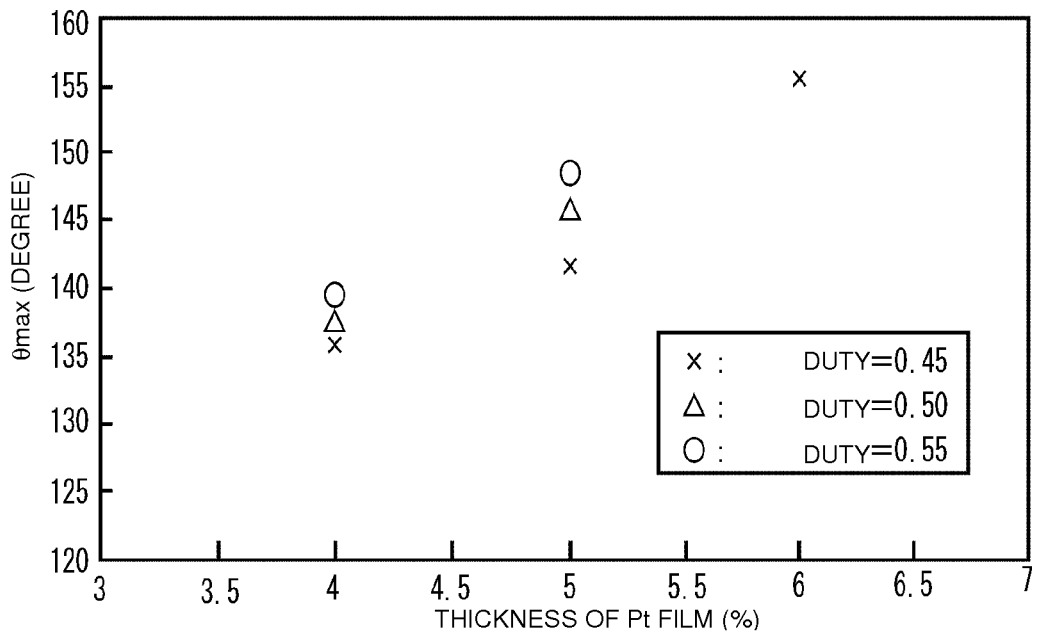
FIG. 8 is a graph plotting the relationship between a thickness (%) of a Pt film disposed as a main electrode on the $LiTaO_3$ substrate, a duty ratio of the IDT electrode, and a maximum phase value.
Figure 9:
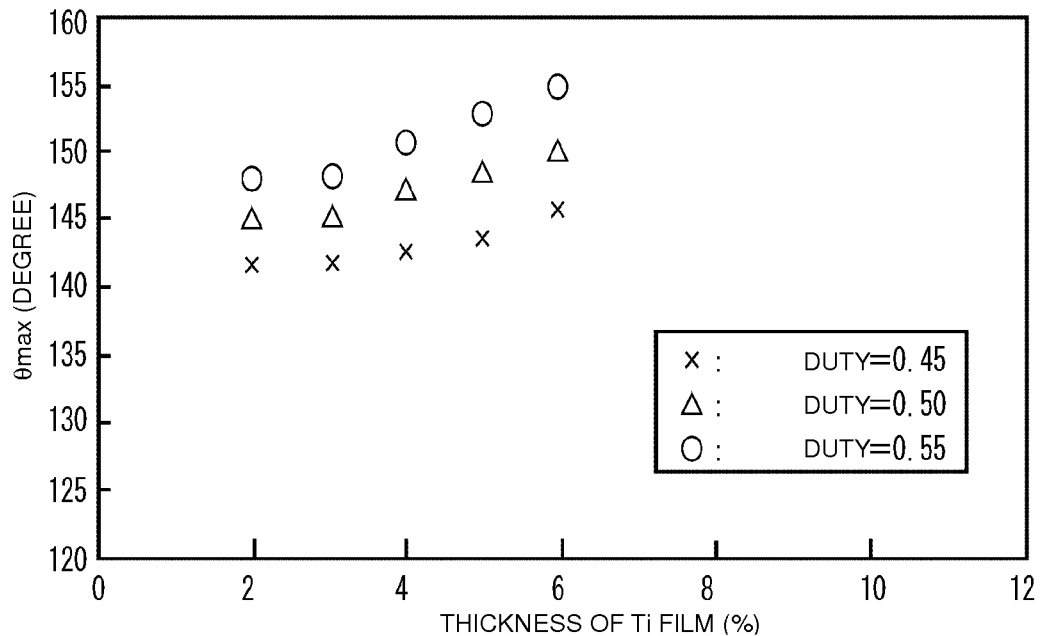
FIG. 9 is a graph plotting the relationship between a total thickness (%) of Ti films disposed as auxiliary electrode layers on the $LiTaO_3$ substrate, a duty ratio of the IDT electrode, and a maximum phase value.

The measured results are plotted in FIGS. 6 to 9. In FIGS. 6 to 9, a maximum phase value $θ_{max}$ of a vertical axis represents a value of phase at which the degree of energy concentration is maximized. FIG. 6 plots change of the maximum phase value $θ_{max}$ when the groove depth A was changed. FIGS. 7 to 9 plot changes of the maximum phase value $θ_{max}$ when the film thickness of the silicon oxide layer, the film thickness of the Pt film, and the total film thickness of the Ti films 13 and 15 were changed, respectively.

As seen from FIGS. 6 to 9, $θ_{max}$ at which the degree of energy concentration is maximized is present for each of the conditions, and $θ_{max}$ is changed by changing each condition.

In view of the results obtained with the THIRD EXAMPLE and the FOURTH EXAMPLE, for the same structure as that in the THIRD EXAMPLE, the maximum phase value $θ_{max}$ maximizing the degree of energy concentration was measured by the finite element method in optional combinations of the film thickness of the silicon nitride layer 7=116% and the film thickness of the Al film 14=16%, as well as respective parameter ranges of the depth A of the groove 2a=0 to 10%, the thickness B of the silicon oxide layer 6=30 to 80%, the thickness D of the Pt film 12=3 to 6%, the total film thickness F of the Ti films 13 and 15, which were positioned above the Pt film 12, between the Ti films 11, 13 and 15=0 to 11%, the duty=0.45 to 0.55, and θ of the Euler angles=120° to 180°. The measured results are listed in Table 1 to 5.

TABLE 1

| Groove [%] A | SiO$_2$ [%] B | Density of Main Electrode [g/cm$^3$] C | Film Thickness of Main Electrode (%) D | Density of Auxiliary Electrode [g/cm$^3$] E | Film Thickness of Auxiliary Electrode (%) F | Duty G | θ max [deg.] |
|---|---|---|---|---|---|---|---|
| 5 | 40 | 21.45 | 4 | 4.54 | 2 | 0.45 | 139 |
| 5 | 40 | 21.45 | 4 | 4.54 | 2 | 0.5 | 141 |
| 5 | 40 | 21.45 | 4 | 4.54 | 2 | 0.55 | 142 |
| 5 | 40 | 21.45 | 4 | 4.54 | 4 | 0.5 | 142 |
| 5 | 40 | 21.45 | 4 | 4.54 | 4 | 0.55 | 144 |
| 5 | 40 | 21.45 | 4 | 4.54 | 6 | 0.45 | 142 |
| 5 | 40 | 21.45 | 4 | 4.54 | 6 | 0.5 | 144 |
| 5 | 40 | 21.45 | 4 | 4.54 | 6 | 0.55 | 146 |
| 5 | 40 | 21.45 | 5 | 4.54 | 1 | 0.45 | 145 |
| 5 | 40 | 21.45 | 5 | 4.54 | 1 | 0.5 | 149 |
| 5 | 40 | 21.45 | 5 | 4.54 | 1 | 0.55 | 153 |
| 5 | 40 | 21.45 | 5 | 4.54 | 3 | 0.45 | 148 |
| 5 | 40 | 21.45 | 5 | 4.54 | 3 | 0.5 | 153 |
| 5 | 40 | 21.45 | 5 | 4.54 | 3 | 0.55 | 158 |
| 5 | 40 | 21.45 | 5 | 4.54 | 5 | 0.45 | 152 |
| 5 | 40 | 21.45 | 5 | 4.54 | 5 | 0.5 | 158 |
| 5 | 40 | 21.45 | 5 | 4.54 | 5 | 0.55 | 167 |
| 5 | 60 | 21.45 | 4 | 4.54 | 2 | 0.45 | 138 |
| 5 | 60 | 21.45 | 4 | 4.54 | 2 | 0.5 | 140 |
| 5 | 60 | 21.45 | 4 | 4.54 | 2 | 0.55 | 142 |
| 5 | 60 | 21.45 | 4 | 4.54 | 4 | 0.45 | 140 |
| 5 | 60 | 21.45 | 4 | 4.54 | 4 | 0.5 | 141 |
| 5 | 60 | 21.45 | 4 | 4.54 | 4 | 0.55 | 143 |
| 5 | 60 | 21.45 | 4 | 4.54 | 6 | 0.45 | 141 |
| 5 | 60 | 21.45 | 4 | 4.54 | 6 | 0.5 | 143 |
| 5 | 60 | 21.45 | 4 | 4.54 | 6 | 0.55 | 146 |
| 5 | 60 | 21.45 | 5 | 4.54 | 1 | 0.45 | 145 |
| 5 | 60 | 21.45 | 5 | 4.54 | 1 | 0.5 | 148 |
| 5 | 60 | 21.45 | 5 | 4.54 | 1 | 0.55 | 151 |
| 5 | 60 | 21.45 | 5 | 4.54 | 3 | 0.45 | 147 |
| 5 | 60 | 21.45 | 5 | 4.54 | 3 | 0.5 | 151 |
| 5 | 60 | 21.45 | 5 | 4.54 | 3 | 0.55 | 156 |
| 5 | 60 | 21.45 | 5 | 4.54 | 5 | 0.45 | 150 |
| 5 | 60 | 21.45 | 5 | 4.54 | 5 | 0.5 | 155 |
| 5 | 80 | 21.45 | 4 | 4.54 | 2 | 0.45 | 138 |
| 5 | 80 | 21.45 | 4 | 4.54 | 2 | 0.5 | 140 |
| 5 | 80 | 21.45 | 4 | 4.54 | 2 | 0.55 | 142 |
| 5 | 80 | 21.45 | 4 | 4.54 | 4 | 0.45 | 140 |
| 5 | 80 | 21.45 | 4 | 4.54 | 4 | 0.5 | 141 |
| 5 | 80 | 21.45 | 4 | 4.54 | 4 | 0.55 | 144 |
| 5 | 80 | 21.45 | 4 | 4.54 | 6 | 0.45 | 141 |
| 5 | 80 | 21.45 | 4 | 4.54 | 6 | 0.5 | 143 |
| 5 | 80 | 21.45 | 4 | 4.54 | 6 | 0.55 | 146 |
| 5 | 80 | 21.45 | 5 | 4.54 | 1 | 0.45 | 145 |
| 5 | 80 | 21.45 | 5 | 4.54 | 1 | 0.5 | 148 |
| 5 | 80 | 21.45 | 5 | 4.54 | 1 | 0.55 | 151 |
| 5 | 80 | 21.45 | 5 | 4.54 | 3 | 0.45 | 147 |
| 5 | 80 | 21.45 | 5 | 4.54 | 3 | 0.5 | 150 |
| 5 | 80 | 21.45 | 5 | 4.54 | 3 | 0.55 | 156 |
| 5 | 80 | 21.45 | 5 | 4.54 | 5 | 0.45 | 149 |
| 5 | 80 | 21.45 | 5 | 4.54 | 5 | 0.5 | 154 |
| 6 | 40 | 21.45 | 4 | 4.54 | 3 | 0.45 | 136 |
| 6 | 40 | 21.45 | 4 | 4.54 | 3 | 0.5 | 138 |
| 6 | 40 | 21.45 | 4 | 4.54 | 3 | 0.55 | 140 |
| 6 | 40 | 21.45 | 4 | 4.54 | 7 | 0.5 | 141 |
| 6 | 40 | 21.45 | 4 | 4.54 | 7 | 0.55 | 143 |
| 6 | 40 | 21.45 | 5 | 4.54 | 2 | 0.45 | 142 |
| 6 | 40 | 21.45 | 5 | 4.54 | 2 | 0.5 | 145 |
| 6 | 40 | 21.45 | 5 | 4.54 | 2 | 0.55 | 148 |
| 6 | 40 | 21.45 | 5 | 4.54 | 6 | 0.45 | 146 |
| 6 | 40 | 21.45 | 5 | 4.54 | 6 | 0.5 | 150 |
| 6 | 40 | 21.45 | 5 | 4.54 | 6 | 0.55 | 155 |

TABLE 2

| Groove [%] A | SiO$_2$ [%] B | Density of Main Electrode [g/cm$^3$] C | Film Thickness of Main Electrode (%) D | Density of Auxiliary Electrode [g/cm$^3$] E | Film Thickness of Auxiliary Electrode (%) F | Duty G | θ max [deg.] |
|---|---|---|---|---|---|---|---|
| 6 | 40 | 21.45 | 6 | 4.54 | 1 | 0.45 | 152 |
| 6 | 40 | 21.45 | 6 | 4.54 | 1 | 0.5 | 162 |

TABLE 2-continued

| Groove [%] A | SiO₂ [%] B | Density of Main Electrode [g/cm³] C | Film Thickness of Main Electrode (%) D | Density of Auxiliary Electrode [g/cm³] E | Film Thickness of Auxiliary Electrode (%) F | Duty G | θ max [deg.] |
|---|---|---|---|---|---|---|---|
| 6 | 40 | 21.45 | 6 | 4.54 | 1 | 0.55 | 166 |
| 6 | 60 | 21.45 | 5 | 4.54 | 6 | 0.45 | 145 |
| 6 | 60 | 21.45 | 5 | 4.54 | 6 | 0.5 | 148 |
| 6 | 60 | 21.45 | 5 | 4.54 | 6 | 0.55 | 154 |
| 6 | 60 | 21.45 | 6 | 4.54 | 1 | 0.45 | 150 |
| 6 | 60 | 21.45 | 6 | 4.54 | 1 | 0.5 | 157 |
| 6 | 80 | 21.45 | 4 | 4.54 | 7 | 0.45 | 138 |
| 6 | 80 | 21.45 | 4 | 4.54 | 7 | 0.5 | 140 |
| 6 | 80 | 21.45 | 4 | 4.54 | 7 | 0.55 | 143 |
| 6 | 80 | 21.45 | 5 | 4.54 | 6 | 0.45 | 145 |
| 6 | 80 | 21.45 | 5 | 4.54 | 6 | 0.5 | 148 |
| 6 | 80 | 21.45 | 5 | 4.54 | 6 | 0.55 | 154 |
| 6 | 80 | 21.45 | 6 | 4.54 | 1 | 0.45 | 149 |
| 6 | 80 | 21.45 | 6 | 4.54 | 1 | 0.5 | 156 |
| 7 | 40 | 21.45 | 4 | 4.54 | 8 | 0.45 | 137 |
| 7 | 40 | 21.45 | 4 | 4.54 | 8 | 0.5 | 139 |
| 7 | 40 | 21.45 | 4 | 4.54 | 8 | 0.55 | 141 |
| 7 | 40 | 21.45 | 5 | 4.54 | 3 | 0.45 | 139 |
| 7 | 40 | 21.45 | 5 | 4.54 | 3 | 0.5 | 141 |
| 7 | 40 | 21.45 | 5 | 4.54 | 3 | 0.55 | 144 |
| 7 | 40 | 21.45 | 5 | 4.54 | 7 | 0.45 | 142 |
| 7 | 40 | 21.45 | 5 | 4.54 | 7 | 0.5 | 145 |
| 7 | 40 | 21.45 | 5 | 4.54 | 7 | 0.55 | 149 |
| 7 | 40 | 21.45 | 6 | 4.54 | 2 | 0.45 | 145 |
| 7 | 40 | 21.45 | 6 | 4.54 | 2 | 0.5 | 151 |
| 7 | 40 | 21.45 | 6 | 4.54 | 2 | 0.55 | 158 |
| 7 | 40 | 21.45 | 6 | 4.54 | 6 | 0.45 | 152 |
| 7 | 40 | 21.45 | 6 | 4.54 | 6 | 0.5 | 165 |
| 7 | 40 | 21.45 | 6 | 4.54 | 6 | 0.55 | 161 |
| 7 | 60 | 21.45 | 4 | 4.54 | 4 | 0.45 | 134 |
| 7 | 60 | 21.45 | 4 | 4.54 | 4 | 0.5 | 136 |
| 7 | 60 | 21.45 | 4 | 4.54 | 4 | 0.55 | 138 |
| 7 | 60 | 21.45 | 4 | 4.54 | 8 | 0.45 | 136 |
| 7 | 60 | 21.45 | 4 | 4.54 | 8 | 0.5 | 138 |
| 7 | 60 | 21.45 | 4 | 4.54 | 8 | 0.55 | 140 |
| 7 | 60 | 21.45 | 5 | 4.54 | 3 | 0.45 | 138 |
| 7 | 60 | 21.45 | 5 | 4.54 | 3 | 0.5 | 141 |
| 7 | 60 | 21.45 | 5 | 4.54 | 3 | 0.55 | 143 |
| 7 | 60 | 21.45 | 5 | 4.54 | 7 | 0.45 | 141 |
| 7 | 60 | 21.45 | 5 | 4.54 | 7 | 0.5 | 144 |
| 7 | 60 | 21.45 | 5 | 4.54 | 7 | 0.55 | 148 |
| 7 | 60 | 21.45 | 6 | 4.54 | 2 | 0.45 | 144 |
| 7 | 60 | 21.45 | 6 | 4.54 | 2 | 0.5 | 149 |
| 7 | 60 | 21.45 | 6 | 4.54 | 2 | 0.55 | 155 |
| 7 | 80 | 21.45 | 4 | 4.54 | 7 | 0.55 | 139 |
| 7 | 80 | 21.45 | 4 | 4.54 | 8 | 0.45 | 136 |
| 7 | 80 | 21.45 | 4 | 4.54 | 8 | 0.5 | 138 |
| 7 | 80 | 21.45 | 4 | 4.54 | 8 | 0.55 | 140 |
| 7 | 80 | 21.45 | 5 | 4.54 | 3 | 0.45 | 138 |
| 7 | 80 | 21.45 | 5 | 4.54 | 3 | 0.5 | 141 |
| 7 | 80 | 21.45 | 5 | 4.54 | 3 | 0.55 | 143 |
| 7 | 80 | 21.45 | 5 | 4.54 | 7 | 0.45 | 141 |
| 7 | 80 | 21.45 | 5 | 4.54 | 7 | 0.5 | 143 |
| 7 | 80 | 21.45 | 5 | 4.54 | 7 | 0.55 | 148 |
| 7 | 80 | 21.45 | 6 | 4.54 | 2 | 0.45 | 144 |
| 7 | 80 | 21.45 | 6 | 4.54 | 2 | 0.5 | 149 |
| 7 | 80 | 21.45 | 6 | 4.54 | 2 | 0.55 | 155 |
| 8 | 40 | 21.45 | 4 | 4.54 | 9 | 0.45 | 135 |
| 8 | 40 | 21.45 | 4 | 4.54 | 9 | 0.5 | 137 |
| 8 | 40 | 21.45 | 4 | 4.54 | 9 | 0.55 | 139 |

TABLE 3

| Groove [%] A | SiO₂ [%] B | Density of Main Electrode [g/cm³] C | Film Thickness of Main Electrode (%) D | Density of Auxiliary Electrode [g/cm³] E | Film Thickness of Auxiliary Electrode (%) F | Duty G | θ max [deg.] |
|---|---|---|---|---|---|---|---|
| 8 | 40 | 21.45 | 5 | 4.54 | 4 | 0.45 | 137 |
| 8 | 40 | 21.45 | 5 | 4.54 | 4 | 0.5 | 139 |
| 8 | 40 | 21.45 | 5 | 4.54 | 4 | 0.55 | 142 |
| 8 | 40 | 21.45 | 5 | 4.54 | 8 | 0.45 | 139 |

TABLE 3-continued

| Groove [%] A | SiO$_2$ [%] B | Density of Main Electrode [g/cm$^3$] C | Film Thickness of Main Electrode (%) D | Density of Auxiliary Electrode [g/cm$^3$] E | Film Thickness of Auxiliary Electrode (%) F | Duty G | θ max [deg.] |
|---|---|---|---|---|---|---|---|
| 8 | 40 | 21.45 | 5 | 4.54 | 8 | 0.5 | 142 |
| 8 | 40 | 21.45 | 5 | 4.54 | 8 | 0.55 | 145 |
| 8 | 40 | 21.45 | 6 | 4.54 | 3 | 0.45 | 142 |
| 8 | 40 | 21.45 | 6 | 4.54 | 3 | 0.5 | 145 |
| 8 | 40 | 21.45 | 6 | 4.54 | 3 | 0.55 | 151 |
| 8 | 40 | 21.45 | 6 | 4.54 | 7 | 0.45 | 145 |
| 8 | 40 | 21.45 | 6 | 4.54 | 7 | 0.5 | 153 |
| 8 | 40 | 21.45 | 6 | 4.54 | 7 | 0.55 | 162 |
| 8 | 60 | 21.45 | 4 | 4.54 | 5 | 0.45 | 133 |
| 8 | 60 | 21.45 | 4 | 4.54 | 5 | 0.5 | 135 |
| 8 | 60 | 21.45 | 4 | 4.54 | 5 | 0.55 | 136 |
| 8 | 60 | 21.45 | 4 | 4.54 | 9 | 0.45 | 134 |
| 8 | 60 | 21.45 | 4 | 4.54 | 9 | 0.5 | 136 |
| 8 | 60 | 21.45 | 4 | 4.54 | 9 | 0.55 | 138 |
| 8 | 60 | 21.45 | 5 | 4.54 | 4 | 0.45 | 136 |
| 8 | 60 | 21.45 | 5 | 4.54 | 4 | 0.5 | 138 |
| 8 | 60 | 21.45 | 5 | 4.54 | 4 | 0.55 | 141 |
| 8 | 60 | 21.45 | 5 | 4.54 | 8 | 0.45 | 138 |
| 8 | 60 | 21.45 | 5 | 4.54 | 8 | 0.5 | 141 |
| 8 | 60 | 21.45 | 5 | 4.54 | 8 | 0.55 | 144 |
| 8 | 60 | 21.45 | 6 | 4.54 | 3 | 0.45 | 140 |
| 8 | 60 | 21.45 | 6 | 4.54 | 3 | 0.5 | 144 |
| 8 | 60 | 21.45 | 6 | 4.54 | 3 | 0.55 | 148 |
| 8 | 60 | 21.45 | 6 | 4.54 | 7 | 0.45 | 144 |
| 8 | 60 | 21.45 | 6 | 4.54 | 7 | 0.5 | 149 |
| 8 | 60 | 21.45 | 6 | 4.54 | 7 | 0.55 | 162 |
| 8 | 80 | 21.45 | 4 | 4.54 | 5 | 0.45 | 133 |
| 8 | 80 | 21.45 | 4 | 4.54 | 5 | 0.5 | 134 |
| 8 | 80 | 21.45 | 4 | 4.54 | 5 | 0.55 | 136 |
| 8 | 80 | 21.45 | 4 | 4.54 | 9 | 0.45 | 134 |
| 8 | 80 | 21.45 | 4 | 4.54 | 9 | 0.5 | 136 |
| 8 | 80 | 21.45 | 4 | 4.54 | 9 | 0.55 | 138 |
| 8 | 80 | 21.45 | 5 | 4.54 | 4 | 0.45 | 136 |
| 8 | 80 | 21.45 | 5 | 4.54 | 4 | 0.5 | 138 |
| 8 | 80 | 21.45 | 5 | 4.54 | 4 | 0.55 | 140 |
| 8 | 80 | 21.45 | 5 | 4.54 | 8 | 0.45 | 138 |
| 8 | 80 | 21.45 | 5 | 4.54 | 8 | 0.5 | 140 |
| 8 | 80 | 21.45 | 5 | 4.54 | 8 | 0.55 | 144 |
| 8 | 80 | 21.45 | 6 | 4.54 | 3 | 0.45 | 140 |
| 8 | 80 | 21.45 | 6 | 4.54 | 3 | 0.5 | 144 |
| 8 | 80 | 21.45 | 6 | 4.54 | 3 | 0.55 | 148 |
| 8 | 80 | 21.45 | 6 | 4.54 | 7 | 0.45 | 144 |
| 8 | 80 | 21.45 | 6 | 4.54 | 7 | 0.5 | 148 |
| 8 | 80 | 21.45 | 6 | 4.54 | 7 | 0.55 | 159 |
| 9 | 40 | 21.45 | 4 | 4.54 | 6 | 0.45 | 132 |
| 9 | 40 | 21.45 | 4 | 4.54 | 6 | 0.5 | 133 |
| 9 | 40 | 21.45 | 4 | 4.54 | 6 | 0.55 | 135 |
| 9 | 40 | 21.45 | 4 | 4.54 | 10 | 0.45 | 133 |
| 9 | 40 | 21.45 | 4 | 4.54 | 10 | 0.5 | 135 |
| 9 | 40 | 21.45 | 4 | 4.54 | 10 | 0.55 | 137 |
| 9 | 40 | 21.45 | 5 | 4.54 | 5 | 0.45 | 135 |
| 9 | 40 | 21.45 | 5 | 4.54 | 5 | 0.5 | 137 |
| 9 | 40 | 21.45 | 5 | 4.54 | 5 | 0.55 | 139 |
| 9 | 40 | 21.45 | 5 | 4.54 | 9 | 0.45 | 136 |
| 9 | 40 | 21.45 | 5 | 4.54 | 9 | 0.5 | 139 |
| 9 | 40 | 21.45 | 5 | 4.54 | 9 | 0.55 | 142 |
| 9 | 40 | 21.45 | 6 | 4.54 | 4 | 0.45 | 139 |
| 9 | 40 | 21.45 | 6 | 4.54 | 4 | 0.5 | 142 |
| 9 | 40 | 21.45 | 6 | 4.54 | 4 | 0.55 | 146 |
| 9 | 40 | 21.45 | 6 | 4.54 | 8 | 0.45 | 141 |
| 9 | 40 | 21.45 | 6 | 4.54 | 8 | 0.5 | 147 |
| 9 | 40 | 21.45 | 6 | 4.54 | 8 | 0.55 | 153 |

TABLE 4

| Groove [%] A | SiO$_2$ [%] B | Density of Main Electrode [g/cm$^3$] C | Film Thickness of Main Electrode (%) D | Density of Auxiliary Electrode [g/cm$^3$] E | Film Thickness of Auxiliary Electrode (%) F | Duty G | θ max [deg.] |
|---|---|---|---|---|---|---|---|
| 9 | 60 | 21.45 | 4 | 4.54 | 6 | 0.45 | 132 |
| 9 | 60 | 21.45 | 4 | 4.54 | 6 | 0.5 | 133 |

TABLE 4-continued

| Groove [%] A | SiO$_2$ [%] B | Density of Main Electrode [g/cm$^3$] C | Film Thickness of Main Electrode (%) D | Density of Auxiliary Electrode [g/cm$^3$] E | Film Thickness of Auxiliary Electrode (%) F | Duty G | θ max [deg.] |
|---|---|---|---|---|---|---|---|
| 9 | 60 | 21.45 | 4 | 4.54 | 6 | 0.55 | 135 |
| 9 | 60 | 21.45 | 4 | 4.54 | 10 | 0.45 | 133 |
| 9 | 60 | 21.45 | 4 | 4.54 | 10 | 0.5 | 135 |
| 9 | 60 | 21.45 | 4 | 4.54 | 10 | 0.55 | 136 |
| 9 | 60 | 21.45 | 5 | 4.54 | 5 | 0.45 | 134 |
| 9 | 60 | 21.45 | 5 | 4.54 | 5 | 0.5 | 136 |
| 9 | 60 | 21.45 | 5 | 4.54 | 5 | 0.55 | 139 |
| 9 | 60 | 21.45 | 5 | 4.54 | 9 | 0.45 | 136 |
| 9 | 60 | 21.45 | 5 | 4.54 | 9 | 0.5 | 138 |
| 9 | 60 | 21.45 | 5 | 4.54 | 9 | 0.55 | 141 |
| 9 | 60 | 21.45 | 6 | 4.54 | 4 | 0.45 | 138 |
| 9 | 60 | 21.45 | 6 | 4.54 | 4 | 0.5 | 141 |
| 9 | 60 | 21.45 | 6 | 4.54 | 4 | 0.55 | 144 |
| 9 | 60 | 21.45 | 6 | 4.54 | 8 | 0.45 | 140 |
| 9 | 60 | 21.45 | 6 | 4.54 | 8 | 0.5 | 144 |
| 9 | 60 | 21.45 | 6 | 4.54 | 8 | 0.55 | 151 |
| 9 | 80 | 21.45 | 4 | 4.54 | 6 | 0.45 | 132 |
| 9 | 80 | 21.45 | 4 | 4.54 | 6 | 0.5 | 133 |
| 9 | 80 | 21.45 | 4 | 4.54 | 6 | 0.55 | 135 |
| 9 | 80 | 21.45 | 4 | 4.54 | 10 | 0.45 | 133 |
| 9 | 80 | 21.45 | 4 | 4.54 | 10 | 0.5 | 134 |
| 9 | 80 | 21.45 | 4 | 4.54 | 10 | 0.55 | 136 |
| 9 | 80 | 21.45 | 5 | 4.54 | 5 | 0.45 | 134 |
| 9 | 80 | 21.45 | 5 | 4.54 | 5 | 0.5 | 136 |
| 9 | 80 | 21.45 | 5 | 4.54 | 5 | 0.55 | 138 |
| 9 | 80 | 21.45 | 5 | 4.54 | 9 | 0.45 | 136 |
| 9 | 80 | 21.45 | 5 | 4.54 | 9 | 0.5 | 138 |
| 9 | 80 | 21.45 | 5 | 4.54 | 9 | 0.55 | 141 |
| 9 | 80 | 21.45 | 6 | 4.54 | 4 | 0.45 | 137 |
| 9 | 80 | 21.45 | 6 | 4.54 | 4 | 0.5 | 141 |
| 9 | 80 | 21.45 | 6 | 4.54 | 4 | 0.55 | 144 |
| 9 | 80 | 21.45 | 6 | 4.54 | 8 | 0.45 | 140 |
| 9 | 80 | 21.45 | 6 | 4.54 | 8 | 0.5 | 143 |
| 9 | 80 | 21.45 | 6 | 4.54 | 8 | 0.55 | 151 |
| 10 | 40 | 21.45 | 4 | 4.54 | 7 | 0.45 | 131 |
| 10 | 40 | 21.45 | 4 | 4.54 | 7 | 0.5 | 132 |
| 10 | 40 | 21.45 | 4 | 4.54 | 7 | 0.55 | 134 |
| 10 | 40 | 21.45 | 4 | 4.54 | 11 | 0.45 | 132 |
| 10 | 40 | 21.45 | 4 | 4.54 | 11 | 0.5 | 133 |
| 10 | 40 | 21.45 | 4 | 4.54 | 11 | 0.55 | 135 |
| 10 | 40 | 21.45 | 5 | 4.54 | 6 | 0.45 | 133 |
| 10 | 40 | 21.45 | 5 | 4.54 | 6 | 0.5 | 135 |
| 10 | 40 | 21.45 | 5 | 4.54 | 6 | 0.55 | 137 |
| 10 | 40 | 21.45 | 5 | 4.54 | 10 | 0.45 | 134 |
| 10 | 40 | 21.45 | 5 | 4.54 | 10 | 0.5 | 137 |
| 10 | 40 | 21.45 | 5 | 4.54 | 10 | 0.55 | 140 |
| 10 | 40 | 21.45 | 6 | 4.54 | 5 | 0.45 | 136 |
| 10 | 40 | 21.45 | 6 | 4.54 | 5 | 0.5 | 139 |
| 10 | 40 | 21.45 | 6 | 4.54 | 5 | 0.55 | 143 |
| 10 | 40 | 21.45 | 6 | 4.54 | 9 | 0.45 | 138 |
| 10 | 40 | 21.45 | 6 | 4.54 | 9 | 0.5 | 142 |
| 10 | 40 | 21.45 | 6 | 4.54 | 9 | 0.55 | 147 |
| 10 | 60 | 21.45 | 4 | 4.54 | 7 | 0.45 | 130 |
| 10 | 60 | 21.45 | 4 | 4.54 | 7 | 0.5 | 132 |
| 10 | 60 | 21.45 | 4 | 4.54 | 7 | 0.55 | 134 |
| 10 | 60 | 21.45 | 4 | 4.54 | 11 | 0.45 | 131 |
| 10 | 60 | 21.45 | 4 | 4.54 | 11 | 0.5 | 133 |
| 10 | 60 | 21.45 | 4 | 4.54 | 11 | 0.55 | 135 |
| 10 | 60 | 21.45 | 5 | 4.54 | 6 | 0.45 | 133 |
| 10 | 60 | 21.45 | 5 | 4.54 | 6 | 0.5 | 135 |
| 10 | 60 | 21.45 | 5 | 4.54 | 6 | 0.55 | 137 |
| 10 | 60 | 21.45 | 5 | 4.54 | 10 | 0.45 | 134 |
| 10 | 60 | 21.45 | 5 | 4.54 | 10 | 0.5 | 136 |
| 10 | 60 | 21.45 | 5 | 4.54 | 10 | 0.55 | 139 |

TABLE 5

| Groove [%] A | SiO$_2$ [%] B | Density of Main Electrode [g/cm$^3$] C | Film Thickness of Main Electrode (%) D | Density of Auxiliary Electrode [g/cm$^3$] E | Film Thickness of Auxiliary Electrode (%) F | Duty G | θ max [deg.] |
|---|---|---|---|---|---|---|---|
| 10 | 60 | 21.45 | 6 | 4.54 | 5 | 0.45 | 136 |
| 10 | 60 | 21.45 | 6 | 4.54 | 5 | 0.5 | 138 |
| 10 | 60 | 21.45 | 6 | 4.54 | 5 | 0.55 | 142 |
| 10 | 60 | 21.45 | 6 | 4.54 | 9 | 0.45 | 137 |
| 10 | 60 | 21.45 | 6 | 4.54 | 9 | 0.5 | 141 |
| 10 | 60 | 21.45 | 6 | 4.54 | 9 | 0.55 | 145 |
| 10 | 80 | 21.45 | 4 | 4.54 | 7 | 0.45 | 130 |
| 10 | 80 | 21.45 | 4 | 4.54 | 7 | 0.5 | 132 |
| 10 | 80 | 21.45 | 4 | 4.54 | 7 | 0.55 | 134 |
| 10 | 80 | 21.45 | 4 | 4.54 | 11 | 0.45 | 132 |
| 10 | 80 | 21.45 | 4 | 4.54 | 11 | 0.5 | 133 |
| 10 | 80 | 21.45 | 4 | 4.54 | 11 | 0.55 | 135 |
| 10 | 80 | 21.45 | 5 | 4.54 | 6 | 0.45 | 133 |
| 10 | 80 | 21.45 | 5 | 4.54 | 6 | 0.5 | 134 |
| 10 | 80 | 21.45 | 5 | 4.54 | 6 | 0.55 | 137 |
| 10 | 80 | 21.45 | 5 | 4.54 | 10 | 0.45 | 134 |
| 10 | 80 | 21.45 | 5 | 4.54 | 10 | 0.5 | 136 |
| 10 | 80 | 21.45 | 5 | 4.54 | 10 | 0.55 | 138 |
| 10 | 80 | 21.45 | 6 | 4.54 | 5 | 0.45 | 135 |
| 10 | 80 | 21.45 | 6 | 4.54 | 5 | 0.5 | 138 |
| 10 | 80 | 21.45 | 6 | 4.54 | 5 | 0.55 | 141 |
| 10 | 80 | 21.45 | 6 | 4.54 | 9 | 0.45 | 137 |
| 10 | 80 | 21.45 | 6 | 4.54 | 9 | 0.5 | 140 |
| 10 | 80 | 21.45 | 6 | 4.54 | 9 | 0.55 | 145 |
| 0 | 30 | 21.45 | 3 | 4.54 | 0 | 0.5 | 151 |
| 1 | 30 | 21.45 | 3 | 4.54 | 0 | 0.5 | 147 |
| 2 | 30 | 21.45 | 3 | 4.54 | 0 | 0.5 | 142 |
| 3 | 30 | 21.45 | 3 | 4.54 | 0 | 0.5 | 139 |
| 4 | 30 | 21.45 | 3 | 4.54 | 0 | 0.5 | 137 |
| 5 | 30 | 21.45 | 3 | 4.54 | 0 | 0.5 | 135 |
| 1 | 50 | 21.45 | 3 | 4.54 | 0 | 0.5 | 147 |
| 5 | 50 | 21.45 | 5 | 4.54 | 0 | 0.5 | 149 |
| 6 | 40 | 21.45 | 5 | 7.133 | 3 | 0.5 | 145 |
| 6 | 40 | 21.45 | 5 | 7.874 | 3 | 0.5 | 144 |
| 6 | 40 | 21.45 | 5 | 8.902 | 3 | 0.5 | 145 |
| 6 | 40 | 21.45 | 5 | 8.96 | 3 | 0.5 | 146 |
| 6 | 40 | 21.45 | 5 | 10.22 | 3 | 0.5 | 164 |
| 6 | 40 | 21.45 | 5 | 10.5 | 3 | 0.5 | 153 |
| 6 | 40 | 4.54 | 5 | 4.54 | 3 | 0.5 | 122 |
| 6 | 40 | 7.133 | 5 | 4.54 | 3 | 0.5 | 125 |
| 6 | 40 | 7.874 | 5 | 4.54 | 3 | 0.5 | 123 |
| 6 | 40 | 8.96 | 5 | 4.54 | 3 | 0.5 | 127 |
| 6 | 40 | 10.5 | 5 | 4.54 | 3 | 0.5 | 131 |
| 6 | 40 | 16.6 | 5 | 4.54 | 3 | 0.5 | 134 |
| 6 | 40 | 19.3 | 5 | 4.54 | 3 | 0.5 | 133 |
| 6 | 40 | 19.32 | 5 | 4.54 | 3 | 0.5 | 145 |
| 6 | 40 | 21.45 | 5 | 4.54 | 3 | 0.4 | 140 |
| 6 | 40 | 21.45 | 5 | 4.54 | 3 | 0.5 | 146 |
| 6 | 40 | 21.45 | 5 | 4.54 | 3 | 0.7 | 168 |
| 6 | 20 | 21.45 | 5 | 4.54 | 3 | 0.5 | 157 |
| 6 | 100 | 21.45 | 5 | 4.54 | 3 | 0.5 | 144 |
| 6 | 120 | 21.45 | 5 | 4.54 | 3 | 0.5 | 144 |
| 6 | 140 | 21.45 | 5 | 4.54 | 3 | 0.5 | 144 |

A multivariate linear regression formula was derived from the results listed in Tables 1 to 5. As a consequence, the following formula (1) was obtained.

$$\theta_0 = 65.53G + 0.7568F + 0.8454E + 7.091D + 1.609C - 0.03789B - 3.535A + 60.85 \quad \text{formula (1)}$$

The formula (1) represents a $\theta_0$ value providing a value of $\theta_{max}$ under such conditions that the parameters A to G are held within the above-described respective ranges.

It is hence understood that the degree of energy concentration can be maximized by selecting respective values of the parameters A to G so that $\theta_0$ satisfying the formula (1) is obtained. As a result, in the boundary acoustic wave device 1, the loss in the pass band can be greatly reduced. Further, as described above, the degree of energy concentration can be increased to about 90% or above by setting θ of the Euler angles to fall within the range of about ($\theta_0 - 20°$) or more to about ($\theta_0 + 20°$) or less, and increased to about 99% or above by setting θ to fall within the range of about ($\theta_0 - 10°$) or more to about ($\theta_0 + 10°$) or less, for example.

While the IDT electrodes 3A to 3C preferably are each partially buried in the groove 2a in the direction of thickness, the IDT electrodes 3A to 3C may be each entirely buried in the groove 2a in the direction of thickness such that the upper surfaces of the IDT electrodes 3A to 3C are flush with the upper surface of the piezoelectric substrate 2. Also, while the longitudinally coupled resonator-type boundary acoustic wave device 1 has been described above, the present invention can be applied to various types of the boundary acoustic wave devices without being limited to the 3IDT longitudinally coupled resonator-type boundary acoustic wave device.

While, in the above-described preferred embodiment, the auxiliary electrode layers made of the Ti films 13 and 15 are preferably provided above the Pt film 12 serving as the main electrode layer and the auxiliary electrode layer made of the Ti film 11 is preferably further provided below the main electrode layer, the auxiliary electrode layer(s) may be provided only above or below the main electrode layer. However, the film thickness F of the auxiliary electrode layer in the above-mentioned formula (1) indicates the total film thickness of the auxiliary electrode layers. It is desirable that the film thickness of the auxiliary electrode layer positioned below the main electrode layer is small and is set to be about 1% or less, for example. The reason is that the main electrode layer is positioned at a higher level corresponding to the film thickness of the auxiliary electrode layer positioned below the main electrode layer and the electromechanical coupling coefficient $K^2$ is reduced depending on the higher position of the main electrode layer.

It should be noted that because, as described above, the material, e.g., Ti, of the auxiliary electrode layer has the functions of not only increasing adhesion between the electrode layers and between the electrode layer and the piezoelectric substrate, etc., but also preventing diffusion of the electrode material, the auxiliary electrode layer may be disposed below the main electrode layer as well.

Further, while, in the above-described preferred embodiment, the Pt film 12 is preferably provided as the main electrode layer, a plurality of main electrode layers may be provided. In that case, the thickness D is given by the total thickness of the plural main electrode layers.

The metal of the main electrode layer is not limited to particular one as long as it has a density of about 16 g/cm$^3$ or higher, for example. Preferably, the main electrode layer is made of at least one kind of metal selected from a group consisting of Pt, W, Ta, Au and Ir, or an alloy containing at least one kind of those metals as a main component. By using such a material, reliability can be increased.

The metal of the auxiliary electrode layer is not limited to a particular one as long as it has a density of about 4 g/cm$^3$ or higher, but lower than about 16 g/cm$^3$, for example. Preferably, the auxiliary electrode layer is made of at least one kind of metal selected from a group consisting of Ti, TiO$_2$, TiN, Ni and NiCr. By using such a material, it is possible to increase the adhesion to another electrode layer and the piezoelectric substrate, and to prevent the diffusion of the electrode material between the electrode layers.

While, in the above-described preferred embodiments, the Al film 14 constituting the low-density electrode layer is preferably provided, the low-density electrode layer may be dispensed with.

Further, while Al is preferably used as the material of the low-density electrode layer, the low-density electrode layer may be made of an appropriate metal having a density of lower than about 4 g/cm$^3$, for example. Preferably, the low-density electrode layer is made of Al or an alloy containing Al as a main component. In that case, since the electrical resistance is relatively low, the resistance loss of the IDT electrode can be reduced.

The dielectric layer 7 can be made of an appropriate dielectric material insofar as it exhibits a higher acoustic velocity than the silicon oxide layer 6. Preferable examples of such a dielectric material include silicon nitride, silicon oxynitride, aluminum nitride, aluminum oxide, and silicon. Since any of those materials exhibits a relatively high acoustic velocity, energy of boundary waves can be effectively confined inside the dielectric layer 7. Accordingly, the transmission characteristic can be improved. Further, since silicon nitride, silicon oxynitride, aluminum nitride, aluminum oxide, and silicon are dielectric materials generally used, the dielectric layer 7 can be easily made.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A boundary acoustic wave device comprising:
a piezoelectric substrate made of LiTaO$_3$ and including a groove in an upper surface thereof;
an IDT electrode arranged such that at least a portion of the IDT electrode is buried in the groove of the piezoelectric substrate;
a silicon oxide layer stacked on the piezoelectric substrate; and
a dielectric layer made of a dielectric exhibiting a higher acoustic velocity than the silicon oxide layer; wherein
the IDT electrode includes a main electrode layer made of a metal having a density of about 16 g/cm$^3$ or higher, and an auxiliary electrode layer made of a metal having a density of about 4 g/cm$^3$ or higher, but lower than 16 g/cm$^3$; and
where a wavelength of a boundary acoustic wave excited by the IDT electrode is λ, a depth A of the groove corresponding to a partial length of the IDT electrode buried in the groove is within a range of about 0.1% to about 10% of λ, a film thickness B of the silicon oxide layer is within a range of about 20% to about 140% of λ, the density of the main electrode is denoted by C (g/cm$^3$), a thickness D of the main electrode layer is within a range of about 1% to about 10% of λ, the density of the auxiliary electrode is denoted by E (g/cm$^3$), a thickness F of the auxiliary electrode positioned above the main electrode layer is within a range of about 0% to about 10% of λ, and a duty ratio G of the IDT electrode is within a range of about 0.4 to about 0.7, θ of Euler angles (0°, θ, 0°) of the piezoelectric substrate made of LiTaO$_3$ is within a range of about ($θ_0$−20°) or more to about ($θ_0$+20°) or less with respect to $θ_0$ expressed by:

$$θ_0 = 65.53G + 0.7568F + 0.8454E + 7.091D + 1.609C − 0.03789B − 3.535A + 60.85.$$

2. The boundary acoustic wave device according to claim 1, wherein the groove depth A buried with the IDT electrode is within a range of about 3% to about 10% of the wavelength λ, the film thickness B of the silicon oxide layer is within a range of about 30% to about 80% of λ, the thickness D of the main electrode layer is within a range of about 1% to about 10% of λ, the thickness F of the auxiliary electrode layer positioned above the main electrode layer is about 5% or less, and the duty ratio G of the IDT electrode is within a range of about 0.45 to about 0.55.

3. The boundary acoustic wave device according to claim 1, wherein θ is within a range of about ($θ_0$−10°) or more to about ($θ_0$+10°) or less.

4. The boundary acoustic wave device according to claim 1, wherein the IDT electrode further includes a low-density electrode layer made of a metal having a density of lower than about 4 g/cm$^3$.

5. The boundary acoustic wave device according to claim 4, wherein the low-density electrode layer is made of Al or an alloy containing Al as a main component.

6. The boundary acoustic wave device according to claim 1, wherein the IDT electrode includes the main electrode layer, the auxiliary electrode layer stacked above the main electrode layer, and another auxiliary electrode layer stacked below the main electrode layer.

7. The boundary acoustic wave device according to claim 1, wherein the metal constituting the main electrode layer is at least one metal selected from a group consisting of Pt, W, Ta, Au and Ir, or an alloy containing the at least one metal as a main component.

8. The boundary acoustic wave device according to claim 1, wherein the auxiliary electrode layer is made of at least one metal selected from a group consisting of Ti, $TiO_2$, TiN, Ni and NiCr.

9. The boundary acoustic wave device according to claim 1, wherein the dielectric layer is made of a dielectric material selected from a group consisting of silicon nitride, silicon oxynitride, aluminum nitride, aluminum oxide, and silicon.

* * * * *